United States Patent
Zhang et al.

(10) Patent No.: US 9,840,789 B2
(45) Date of Patent: Dec. 12, 2017

(54) ETCHING IN THE PRESENCE OF ALTERNATING VOLTAGE PROFILE AND RESULTING POROUS STRUCTURE

(71) Applicant: City University of Hong Kong, Kowloon (HK)

(72) Inventors: Jie Zhang, Kowloon (HK); Yang Yang Li, Kowloon (HK); Jian Lu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 691 days.

(21) Appl. No.: 14/159,270

(22) Filed: Jan. 20, 2014

(65) Prior Publication Data

US 2015/0203984 A1    Jul. 23, 2015

(51) Int. Cl.
| | |
|---|---|
| C25F 3/02 | (2006.01) |
| H01L 31/0224 | (2006.01) |
| H01M 4/38 | (2006.01) |
| C25D 13/02 | (2006.01) |
| C25D 13/12 | (2006.01) |

(52) U.S. Cl.
CPC ............ *C25F 3/02* (2013.01); *C25D 13/02* (2013.01); *C25D 13/12* (2013.01); *H01L 31/022425* (2013.01); *H01M 4/38* (2013.01); *Y02E 10/50* (2013.01)

(58) Field of Classification Search
CPC combination set(s) only.
See application file for complete search history.

(56) References Cited

U.S. PATENT DOCUMENTS

| | | | |
|---|---|---|---|
| 5,171,416 A | 12/1992 | Lenhart et al. | |
| 2008/0188836 A1* | 8/2008 | Weber | A61L 29/085 |
| | | | 604/890.1 |
| 2010/0147800 A1 | 6/2010 | Li | |
| 2010/0282613 A1 | 11/2010 | Schuh | |
| 2013/0052475 A1 | 2/2013 | Kim et al. | |

(Continued)

FOREIGN PATENT DOCUMENTS

| | | |
|---|---|---|
| CN | 101104940 A | 1/2008 |
| CN | 101525760 A | 9/2009 |
| CN | 101710616 A | 5/2010 |

(Continued)

OTHER PUBLICATIONS

Aburada, et al., "Synthesis of nanoporous copper by dealloying of Al—Cu—Mg amorphous alloys in acidic solution: the effect of nickel," Corrosion Science, 53, 201, pp. 1627-1632.

(Continued)

*Primary Examiner* — Nicholas A Smith
(74) *Attorney, Agent, or Firm* — Wayne F. Reinke, Esq.; Heslin Rothenberg Farley & Mesiti P.C.

(57) ABSTRACT

A nanoporous metal structure is made by etching a metal alloy structure of two or more metals. Less than all of the metals are selectively removed (e.g., dissolved in solution) from the alloy in the presence of an alternating voltage profile, for example, a periodic voltage profile. The resulting nanoporous metal structure, having pore openings of about 20 nm to about 500 nm in diameter and a purity of at least about 70%, can be further treated to alter some or all of the structure, and/or to add, remove and/or modify properties thereof.

22 Claims, 2 Drawing Sheets

(56) References Cited

U.S. PATENT DOCUMENTS

2015/0017418 A1    1/2015    Tsang et al.
2015/0184309 A1    7/2015    Zhang et al.

FOREIGN PATENT DOCUMENTS

CN    102899681 A    1/2013
WO    2012093880 A2    7/2012

OTHER PUBLICATIONS

Almeida, et al., "Photonic Band Gap Structures by Sol-Gel Processing," Current Opinion in Solid State and Materials Science, 2003, vol. 7, pp. 151-157.

Arico, et al., "Nanostructured Materials for Advanced Energy Conversion and Storage Devices," Nature Materials, 2005, vol. 4, pp. 366-377.

Balusamy, et al., "Effect of Surface Mechanical Attrition Treatment (SMAT) on Boronizing of EN8 Steel," Surface and Coatings, 2012, vol. 213, pp. 221-228.

Bi, et al., "Highly Dispersed RuO2 Nanoparticles on Carbon Nanotubes: Facile Synthesis and Enhanced Supercapacitance Performance," J. Phys. Chem. C., 2010, vol. 114, pp. 2448-2451.

Biener, et al., "Nanoporous Plasmonic Metamaterials," Adv. Mater, 2008, pp. 1211-1217.

Bockstaller, et al., "Block Copolymer Nanocomposites: Perspectives for Tailored Functional Materials," Adv. Mater., 2005, vol. 17, pp. 1331-1349.

Carley, et al., "The Formation and Characterisation of Ni3+—an X-ray Photoelectron Spectroscopic Investigation of Potassium-Doped Ni (110)-O," Surface Science, 1999, vol. 440, pp. L868-L874.

Cheng, et al., "Characterization of Sol-Gel-Derived NiOx Xerogels as Supercapacitors," Journal of Power Sources, 2006, vol. 159, pp. 734-741.

Chigane, et al., "Characterization of Electrochromic Nickel Oxide Thin Films Prepared by Anodic Deposition," J. Chem. Soc. Faraday Trans., 1992, vol. 88, No. 15, pp. 2203-2205.

Chigane, et al., "XRD and XPS Characterization of Electrochromic Nickel Oxide Thin Films Prepared by Electrolysis-Chemical Deposition," J. Chem. Soc., Faraday Trans., 1998, vol. 94, pp. 3665-3670.

Cohen, et al., "Electroplating of Cyclic Multilayered Alloy (CMA) Coatings," J. Electrochem. Soc.: Electrochemical Science and Technology, Oct. 1983, vol. 130, No. 10, pp. 1987-1995.

Conway, B. E., "Transition from 'Supercapacitator' to 'Battery' Behavior in Electrochemical Energy Storage," J. Electrochem. Soc., Jun. 1991, vol. 138, No. 6, pp. 1539-1548.

Corr, et al., "Spontaneously formed porous and composite materials," Journal of Materials Chemistry, 2010, 20, pp. 1413-1422.

Deng, et al., "Three-Dimensionally Ordered Macroporous Cu2O/Ni Inverse Opal Electrodes for Electrochemical Supercapacitors," Phys. Chem. Chem. Phys., 2013, vol. 15, pp. 7479-7483.

Ding, et al., "Controlled Synthesis of Hierarchial NiO Nanosheet Hollow Spheres With Enhanced Supercapacitive Performance," J. Mater. Chem., 2011, vol. 21, pp. 6602-6606.

Ding, et al., "Nanoporous Gold Leaf: 'Ancient Technology'/Advanced Material," Adv. Mater., Nov. 4, 2004, vol. 16, No. 21, pp. 1897-1899.

Ding, et al., "Nanoporous Metal With Controlled Multimodal Pore Size Distribution," J. Am. Chem. Soc., 2003, vol. 125, pp. 7772-7773.

Erlebacher, et al., "Evolution of Nanoporosity in Dealloying," Letters to Nature, Mar. 22, 2001, vol. 410, pp. 450-453.

Fu, et al., "Electrodeposition of Nickel Hydroxide Films on Nickel Foil and its Electrochemical Performances for Supercapacitor," Int. J. Electrochem. Sci., 2009, 4, pp. 1052-1062.

Gamburg, Yu D., "Electrodeposition of Alloys With Composition Modulated Over Their Thickness: A Review," Russian Journal of Electrochemistry, 2001, vol. 37, No. 6, pp. 585-590.

Grosvenor, et al., "New Interpretations of XPS Spectra of Nickel Metal and Oxides," Surface Science, 2006, vol. 600, pp. 1771-1779.

Guan, et al., "Hybrid Structure of Cobalt Monoxide Nanowire @ Nickel Hydroxidenitrate Nanoflake Aligned on Nickel Foam for High-Rate Supercapacitor," Energy Environ. Sci., 2011, pp. 4496-4499.

Hall, et al., "The Photonic Opal—The Jewel in the Crown of Optical Information Processing," Chem. Commun., 2003, pp. 2639-2643.

Hammond, Paula T., "Form and Function in Multilayer Assembly: New Applications at the Nanoscale," Adv. Mater., Aug. 4, 2004, vol. 16, No. 15, pp. 1271-1293.

Hu & Cheng, "Ideally Pseudocapacitive Behavior of Amorphous Hydrous Cobalt-Nickel Oxide Prepared by Anodic Deposition" Electrochemical and Solid-State Letters, 5(3) A43-A46 (2002).

Hu, et al., "Symmetrical MnO2-Carbon Nanotube—Textile Nanostructures for Wearable Pseudocapacitors With High Mass Loading," American Chemical Society, 2011, vol. 5, No. 11, pp. 8904-8913.

Huang, et al., "Fabrication and Surface Functionalization of Nanoporous Gold by Electrochemical Alloying/Dealloying of Au—Zn in an Ionic Liquid, and the Self-Assembly of L-Cysteine Monolayers," Adv. Funct. Mater., 2005, vol. 15, pp. 989-994.

Huang, et al.,: Structure Evolution and Thermal Stability of SMAT-Derviced Nanograined Layer onTi-25Nb-3Mo-3Zr-2Sn Alloy at Elevated Temperatures, Journal of Alloys and Compounds, V2013, vol. 554, pp. 1-11.

Jia, et al., "Nanoporous metal (Cu, Ag, Au) Films with High Surface Area: General Fabrication and Preliminary Electrochemical Performance," J_ Phy. Chem, 2007, vol. 111, No. 24, pp. 8424-8431.

Kim, et al., "Ni—NiO Core-Shell Inverse Opal Electrodes for Supercapacitors," Chem. Commun., 2011, vol. 47, pp. 5214-5216.

Kong, et al., "Electrochemical Fabrication of a Porous Nanstructured Nickel Hydroxide Film Electrode with Superior Pseudocapacitive Performance," Journal of Alloys and Compounds, 2011. vol. 509, pp. 5611-5616.

Kotz, et al., "Principles and Applications of Electrochemical Capacitors," Electrochimica Acta, 2000, vol. 45, pp. 2483-2498.

Lang, et al., "Nanoporous Metal/Oxide Hybrid Electrodes for Electrochemical Supercapacitors," Nature Nanotechnology, Apr. 2011, vol. 6, pp. 232-236.

Lattanzi, et al,. "Supercapacitor Electrodes with High-Energy and Power Densities Prepared from Monolithic NiO/Ni Nanocomposites" 2011, vol. 50, pp. 6847-6850.

Li, et al., "Nanostructured Intermetallics Prepared by DeAlloying from Single Crystal Nickel-Based Superalloys," Intermetallics, 2009, vol. 17, pp. 1065-1069.

Lin, et al., "Modeling the Effects of Electrode Composition and Pore Structure on the Performance of Electrochemical Capacitors," Journal of The Electrochemical Society, 2002, vol. 149, No. 2, pp. A167-A175.

Lin, et al., "Surface Nanocrystallization by Surface Mechanical Attrition Treatment and its Effect on Structure and Properties of Plasma Nitrided AISI 321 Stainless Steel," Acta Materialia, 2006, vol. 54, pp. 5599.5605.

Liu, et al., "Formation of a Core/Shell Microstructure in a Cu—Ni Thin Films," Journal of the Electrochemical Society, 2008, vol. 155, No. 9, pp. D569-D574.

Lu, et al., "Stable Ultrahigh Specific Capacitance of NiO Nanorod Arrays," Nano Res., 2011, vol. 4, No. 7, pp. 658-665.

Lu, et al., "Synthesis of Porous Copper from Nanocrystalline Two-Phase Cu—Zr Film by Dealloying," ScienceDirect, 2007, vol. 56, pp. 165-168.

Mao, et al., "Theoretical Analysis of the Discharge Performance of a NiOOH/H2 Cell," J. Electrochem. Soc., Jan. 1994, vol. 141, No. 1, pp. 54-64.

Martinu, et al., "Plasma Deposition of optical Films and Coatings: A Review," J. Vac. Sci. Technol. A, Nov./Dec. 2000, vol. 18, No. 6, pp. 2619-2645.

Ozbay, Ekmel, "Plasmonics: Merging Photonics and Electronics at Nanoscale Dimensions," Science, Jan. 13, 2006, vol. 311, pp. 189-193.

(56) References Cited

OTHER PUBLICATIONS

Pang, et al., "Porous Nickel Oxide Nanospindles with Huge Specific Capacitance and Long-Life Cycle," RSC Advances, 2012, vol. 2, pp. 2257-2261.

Pikul, et al., "High-Power Lithium Ion Mcrobatteries from Interdigitated Three-Dimensional Bicontinuous Nanoporous Electrodes," Nature Communications, 2013, pp. 1-5.

Qian, et al., "Ultrafine Nanoporous Gold by Low-Temperature Dealloying and Kinetics of Nanopore Formation," Applied Physics Letters, 2007, vol. 91, No. 10, pp. 083105-01 to 083105-02.

Roberts, et al., "The Defect of Nickel Oxide Surfaces as Revealed by Photoelectron Spectroscopy," J. Chem., Faraday Trans. 1, 1984, vol. 80, pp. 2957-2968.

Sailor, Michael J., "Preparation of Spatially Modulated Porous Silicon Layers," Porous Silicon in Practice: Preparation, Characterization and Applications, 2012, pp. 77-117.

Schubert, et al., "Solid-State Light Sources Getting Smart," Science, May 27, 2005, vol. 308, pp. 1274-1278.

Senior, et al., "Synthesis of Tough Nanoporous Metals by Controlled Electrolytic Dealloying," Nanotechnology, 2006, vol. 17, pp. 2311-2316.

Simon, et al., "Materials for Electrochemical Capacitors," Nature Materials, Nov. 2008, vol. 7, pp. 845-854.

Sun, et al., "Fabrication of Nanoporous Nickel by Electrochemical Dealloying," Chem. Mater., 2004, vol. 16, pp. 3125-3129.

Tench, et al., "Enhanced Tensile Strength for Electrodeposited Nickel-Copper Multilayer Composites," Metallurgical Transactions, Nov. 1984, vol. 15A, pp. 2039-2040.

Tong, et al., "Nitriding Iron at Lower Temperatures," Science, 2003, vol. 299, pp. 686-688.

Trapalis, et al., "$TiO_2(Fe^{3+})$ Nanostructured Thin Films With Antibacterial Properties," Thin Solid Films, 2003, vol. 433, pp. 186-190.

Tsang, et al., "Electrochemical Fabrication of Coaxial Wavy-Channel Ni111O (OH)/Ni Nanocomposites for High-Performance Supercapacitor Electrode Materials," Energy Technology, 2013, pp. 478-783.

Tsang, et al., "Metal-Based Photonic Coatings from Electrochemical Deposition," Journal of The Electrochemical Society, 2009, vol. 156, No. 11, pp. D508-D512.

Tsang, et al., Metal-Based Photonic Coatings from Electrochemical Methods, IEEE, 2010.

Varkey, et al., "Solution Growth Technique for Deposition of Nickel Oxide Thin Films," Thin Solid Films, 1993, vol. 235, No. 1, pp. 47-50.

Wang, et al., "Diffusion of Chromium in Nanocrystalline Iron Produced by Means of Surface Mechanical Attrition Treatment," Acta Materialia, 2003, vol. 51, pp. 4319-4329.

Wang, et al., "Green Synthesis of NiO Nanobelts with Exceptional Pseudo-Capacitive Properties," Adv. Energy Mater, 2012, 2, pp. 1188-1192.

Wei, et al., "A Cost-Effective Supercapacitor Material of Ultrahigh Specific Capacitances: Spinel Nickel Cobaltite Aerogels From an Epoxide-Driven Sol-Gel Process," Adv. Mater., 2010, vol. 22, pp. 347-351.

Xia, et al., "High-Quality Metal Oxide Core/Shell Nanowire Arrays on Conductive Substrates for Electrochemical Energy Storage," American Chemical Society, 2012, vol. 6, No. 6, pp. 5531-5538.

Yan, et al., "Advanced Asymmetric Supercapacitors Based on $Ni(OH)_2$/Graphene and Porous Graphene Electrodes With High Energy Density," Adv. Funct. Mater., 2012, vol. 22, pp. 2632-2641.

Yang, et al., "Electrodeposited Nickel Hydroxide on Nickel Foam with Ultrahigh Capacitance," Chem. Commun., 2008, pp. 6537-6539.

Yuan, et al., Facile Synthesis and Self-Assembly of Hierarchical Porous NiO Nano/Micro Spherical Superstructures for High Performance Supercapacitors, Journal of Materials Chemistry, Aug. 28, 2009, vol. 19, No. 32, pp. 5772-5777.

Zhang, et al., "Layer-by-Layer Assembly: From Conventional to Unconventional Methods," Chem. Commun., 2007, pp. 1395-1405.

Zhang, et al., "Three-Dimensional Bicontinuous Ultra-Charge and -Discharge Bulk Battery Electrodes," Nature Nanotechnology, May 2011, vol. 6, pp. 277-281.

Zheng, et al., "Influence of Ammonia Concentration on Anodic Depostion of Nickel Oxide," J. Appl. Electrochem., 2007, 37, pp. 799-803.

Tsang et al., Porous Framework and Method for Its Manufacture, U.S. Appl. No. 13/940,918, filed Jul. 12, 2013.

Zhang et al., "Method of Fabricating Improved Porous Metallic Material and Resulting Structure Thereof," U.S. Appl. No. 14/146,072, filed Jan. 2, 2014.

Tsang et al., Office Action dated May 20, 2015 for U.S. Appl. No. 13/940,918, filed Jul. 12, 2013 (U.S. Patent Application Publication No. 2015/0017418 dated Jan. 15, 2015).

Zhang et al., Office Action dated Aug. 24, 2015 for U.S. Appl. No. 14/146,072, filed Jan. 2, 2014 (U.S. Patent Application Publication No. 2015/0184309 dated Jul. 2, 2015).

Tsang et al., Final Office Action dated Aug. 31, 2015 for U.S. Appl. No. 13/940,918, filed Jul. 12, 2013 (U.S. Patent Application Publication No. 2015/0017418 dated Jan. 15, 2015).

\* cited by examiner

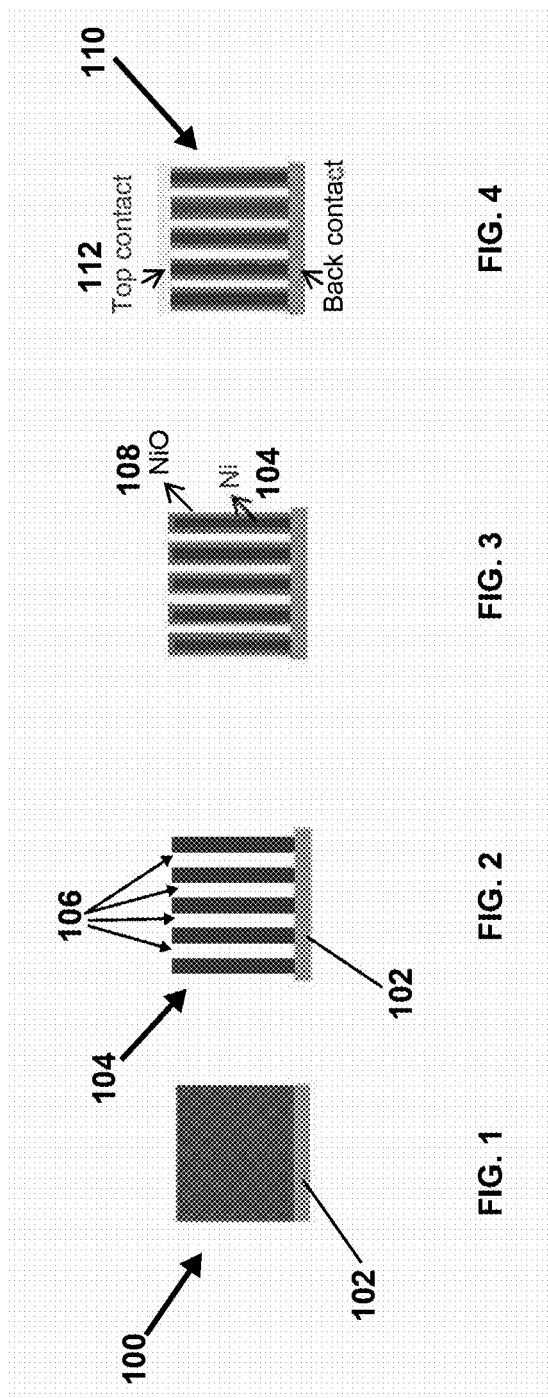

ETCHING IN THE PRESENCE OF ALTERNATING VOLTAGE PROFILE AND RESULTING POROUS STRUCTURE

BACKGROUND OF THE INVENTION

Technical Field

The present invention generally relates to etching. More particularly, the present invention relates to selective removal of one or more, but less than all, materials from an alloy while in the presence of an alternating voltage profile.

Background Information

Etching, i.e., removing one or more materials (e.g., metals) from an alloy, is used to create porous structures. However, existing methods of etching use a constant voltage, resulting in too much of the unwanted metal(s) being left behind, i.e., the purity is too low, and the porosity is inadequate for many applications.

Thus, a need exists for improved methods of etching, as well as improvements in purity and porosity of resulting porous structures.

SUMMARY OF THE INVENTION

The present invention provides, in a first aspect, a method of etching an alloy structure (also known as "dealloying"). The method includes providing an alloy structure of at least two materials, and etching the structure by selectively removing at least one and less than all of the at least two materials from the alloy structure in the presence of an alternating voltage profile.

The present invention provides, in a second aspect, a porous metal structure, including at least one metal and having a plurality of pores with openings of about 20 nm to about 500 nm in diameter and a purity of at least about 70% of the at least one metal.

These, and other objects, features and advantages of this invention will become apparent from the following detailed description of the various aspects of the invention taken in conjunction with the accompanying drawings.

BRIEF DESCRIPTION OF THE DRAWINGS

FIG. 1 depicts a metal alloy structure of nickel and copper on a bottom contact or electrode.

FIG. 2 depicts the structure of FIG. 1 after etching to remove the copper.

FIG. 3 depicts the nanoporous structure of FIG. 2 after creating a conformal layer of nickel oxide over the nickel structure.

FIG. 4 depicts the structure of FIG. 3 after adding a top contact or electrode on top of the nickel oxide layered nickel structure.

DETAILED DESCRIPTION OF THE INVENTION

Figure 7:
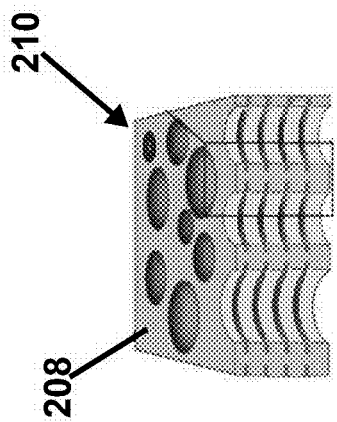
FIGS. 5-7 depict one example of a multilayer nickel-copper alloy etched and coated for use with battery electrodes.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, the term "connected," when used to refer to two physical elements, means a direct connection between the two physical elements. The term "coupled," however, can mean a direct connection or a connection through one or more intermediary elements.

As compared to conventional methods of producing porous structures, e.g., porous metal structures, the present invention is simpler, more economical, and yields a more pure end product with a higher porosity than conventional processes. For example, no vacuum, clean room or sophisticated control systems are necessary, as with microfabrication methods derived from microelectronics. In addition, large areas of porous metal, including nanoporous metal, can be constructed with high uniformity.

In one aspect, the present invention presents a method of etching an alloy structure (also known as "dealloying"). The method includes providing an alloy structure of at least two materials, and etching the structure by selectively removing at least one and less than all of the materials from the alloy structure in the presence of an alternating voltage profile.

Although the present invention is not concerned with how the initial alloy structure is made, one example of how to do so is by using conventional electrodeposition methods. Another example of creating the alloy structure is by melting the constituents together.

In one example, the alloy structure is a metal alloy structure, the at least two materials including at least two metals, and etching in the presence of an alternating voltage profile results in a porous metal structure. In a specific example, the at least one two metals include at least two nanoporous metals, the resulting structure being a nanoporous metal structure.

The metal alloy structure can take many different forms, and the resulting structure after etching typically retains the same shape as the starting alloy. For example, the metal alloy structure and resulting structure can be a film, a rod, belt, disk, ring, etc.

As used herein, the term "nanoporous" refers to the size of pores (diameter) in a porous structure created in accordance with the present invention, the diameter being in a range from about 20 nanometers to about 500 nm. Examples of metals considered to have nanoporous capacity include tungsten, tin, nickel, gold, silver, copper and platinum. In addition, the nanoporous metal structure of the present invention has a purity of at least about 70%.

The alternating voltage profile can take several forms. In one example, the alternating voltage profile is a periodic voltage. In one example, "periodic" can be pulsed. Alternatively, the periodic aspect can be sinusoidal, square, triangle or even custom-made waveforms. In addition, the alternating voltage profile can be non-periodic. For example, an etching voltage alternating between V1 and V2 can be used, with the value of V1 being fixed, and the value of V2 gradually increasing during the etching process.

Selective removal of the unwanted material(s) of the alloy can be accomplished in a number of different ways. For example, an electrochemical process can be used. In a specific example, the selective removal includes etching the metal alloy structure in an electrolytic solution while applying the alternating voltage profile. For example, an alloy of nickel and copper can be etched in an electrolyte solution of 0.5 M nickel (II) sulfamate, 0.005 M copper (II) sulfate, and 0.6 M boric acid, the electrolyte solution acting as a working electrode. In this example, the etching may be done in the presence of a periodic voltage square wave profile, the voltage in each period modulating subsequently between 0.5 V for 1 sec and 0.06 V for 5 sec, i.e., $V_1=0.5$ V, $t_1=1$ s, $V_2=0.06$ V, $t_2=5$ s, etc.

In another example, the metal alloy structure includes a solution of at least two metal salts, for example, nickel (II) sulfamate and copper (II) sulfate. Assume that a pulsed voltage square wave profile is applied to a Ni—Cu alloy with the voltage varying between 0.5 volts and 0.06 volts. The copper is gradually leached out from the alloy. In the base case, the time between pulses is one second and the duration of the pulse is five seconds. If the time between pulses is increased to five seconds from one second, the resulting porous structure, as compared to the base case, showed smaller pores, thicker ligaments, lower porosity (see below) and a lower purity of nickel. In fact, the resulting structure was more similar to the conventional case of a constant voltage, than the present case of a pulsed voltage profile. Where the duration of the pulse is increased to 15 seconds from five seconds, as compared to the base case, the pores were significantly smaller, while the other aspects were similar to the base case. Thus, a time varying voltage applied during etching improves the resulting porous structure, and aspects of the time-varying profile can be fine tuned to achieve a desired result.

To measure porosity, energy dispersive X-Ray (EDX) analysis, for example, can be used to measure the film compositional percentages of the Ni and Cu components before and after the etching process, denoted as $Ni_xCu_y$ and $Ni_aCu_b$, respectively (x+y=a+b=100). Assuming only Cu is removed, the average porosity (the volume fraction of pores) of the as-etched film, denoted asp, can then be calculated by the following equation:

$$p=[100-x-(xb/a)]/100$$

In still another example, the selective removal includes selectively dissolving the unwanted metal or metals in a solution. For example, selectively etching copper from a copper-silver alloy in 0.05 M sulphuric acid, the etching being accomplished by dissolving in the acid.

An electrochemical-based etching process general includes the following steps: 1) the reactive atoms are etched away at the alloy surface; 2) the inert atoms left at the alloy/electrolyte interface rearrange themselves and form clusters, exposing the reactive atoms underneath; 3) the newly exposed reactive atoms are etched; and 4) steps 2 and 3 are repeated until the etching front penetrates throughout the entire alloy material. Thus, the atomic rearrangement and chemical dissolution at the film/electrolyte interface determine the morphology and composition of the etched materials finally obtained. The conventional etching method, either with a constant voltage or no voltage applied, has little control over the interaction between the atom rearrangement and chemical dissolution processes. For conventional etching, chemical dissolution strongly interferes with atomic rearrangement throughout the entire etching process. For example, as soon as the underlying reactive atoms are exposed, they undergo a dissolution reaction, which interferes with the previously ongoing atom rearrangement at the film/electrolyte interface. As a result, the voids created upon the dissolution of these reactive atoms may trigger new atom rearrangements locally; further disturbing the previously ongoing atom rearrangement. On the other hand, the insufficient atom rearrangement can in turn result in less exposure and dissolution of the more reactive atoms. Therefore, the conventional etching methods tend to render high DT/low purity/low porosity samples, due to the incomplete atom rearrangement. As used herein, DT (etching threshold) refers to a compositional threshold of the more reactive material(s) in the alloy needed for etching to take place throughout the alloy. In stark contrast, the pulse etching method of the present invention, with an alternating voltage profile, offers effective control over the interaction between atom rearrangement and chemical dissolution, allowing more sufficient atom rearrangement by suppressing the chemical dissolution reaction frequently, so that resulting etched materials have lower DT, higher purity, and higher porosity in comparison. Additionally, it should be noted that, compared with the conventional etching method, the etching method of the present invention allows for atom rearrangement at a larger scale and is likely to reduce the inhomogeneity in the pre-formed alloy materials. Etching with an alternating voltage profile preserves less of the pre-built structural order in the alloys than conventional etching with a constant voltage. Nevertheless, this "smoothing" effect of the etching method of the present invention can be beneficial in circumstances where a more homogeneous material is desired.

Optionally, the porous metallic structure may be treated to add, remove and/or modify one or more properties thereof. In one example, treating includes coating a surface of a nanoporous metallic structure with one or more materials, for example, coating nanoporous nickel with nickel oxide or manganese oxide for supercapacitor/Li-ion battery applications by using electrodeposition or electroless plating. As one skilled in the art will know, electrodeposition is one of a broad range of industrial processes known collectively as "electrophoretic deposition," which includes electrocoating, e-coating, cathodic electrodeposition, anodic electrodeposition, and electrophoretic coating, or electrophoretic painting. A characteristic feature of this process is that colloidal particles suspended in a liquid medium migrate under the influence of an electric field (electrophoresis) and are deposited onto an electrode. Also, as one skilled in the art will know, electroless plating is simply plating (i.e., depositing a metal layer on a conductive surface) without the application of external electrical power.

Figure 6:
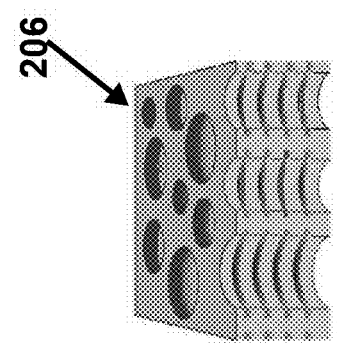
Figure 5:
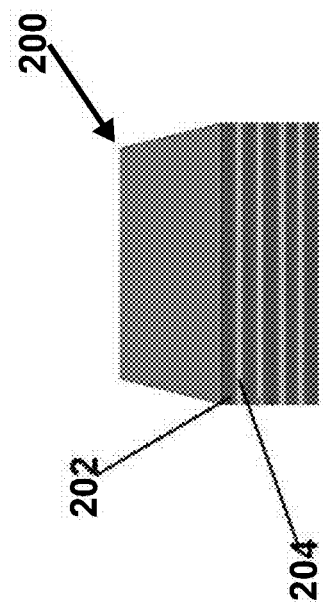

As shown in FIGS. 5-7, a multi-layer alloy 200 includes alternating layers, e.g., layers 202 and 204, of nickel-copper alloys having different mole percentages of nickel and copper. In a specific example, the multilayer alloy includes a desired number of alternating layers of $Ni_{37}Cu_{63}$ and $Ni_{62}Cu_{38}$. Etching the multilayer alloy to remove the copper, for example, using one of the etching strategies described herein, results in a wavy-channel nickel framework 206 shown in FIG. 6. The framework may be coated with, for example, a layer 208 of nickel oxide ($Ni^{III}O(OH)$), the coated framework then being usable as a film 210, for example, as part of a battery electrode.

In another example, the treating includes at least partially filling at least one pore of a porous metallic structure with one or more materials. For example, the pores of a nanoporous metallic structure can be filled with at least one pharmaceutical. For example, the drug vancomycin can be first dissolved in a mixed aqueous/acetonitrile solution and then infused into the nanoporous metal structure, for example, by drop-casting to the nanoporous metal structure. More complex and advanced casting techniques may involve ultrasound, thermal treatment, and/or vacuum. In still another example, the treating includes heating in a predetermined atmosphere to effect a chemical reaction on a surface of a porous metallic structure. For example, the predetermined atmosphere may be oxygen to create a metal oxide on the surface. In a specific example, described with respect to FIGS. 1-4, a nickel-copper alloy 100 on a back contact 102 is etched by soaking the alloy in an electrolyte solution of 0.5 M nickel (II) sulfamate, 0.005 M copper (II) sulfate, and 0.6 M boric acid, and using the alloy as the working electrode with a periodic voltage square wave profile applied. The voltage in each period is subsequently modulated, for example, between 0.5 V for 1 sec and 0.06 V for 5 sec, i.e., $V_1=0.5$ V, $t_1=1$ s, $V_2=0.06$ V, $t_2=5$ s, leaving a nickel structure 104 with nanopores 106. The nickel nanoporous structure may then be heated in oxygen atmosphere at about 300° C. for about 3 hours to create a layer of nickel oxide 108 having a thickness of about 10 nm. The completed structure 110 includes a top conductive contact 112 created by, for example, physical vapor deposition (PVD), e.g., sputtering. As one skilled in the art will know, NiO is a p-type semiconductor, and the structure could be used to create Schottky barrier solar cells.

As yet another example, treating includes causing one or more chemical species to attach to a surface of a porous metallic structure (e.g., a nanoporous metal structure). For example, possible chemical species include organic molecules, inorganic materials and biomolecules. For example, titanium dioxide attached to an etched nanoporous metal structure using, for example, atomic layer deposition. In a specific example, a titanium dioxide thin film can be attached to the etched nanoporous metallic structure (used as a substrate) by atomic layer deposition, for example, using $Ti(OC_3H_7)_4$ and $O_3$ as precursor and oxidant, respectively, at a substrate temperature of about 250° C.

The metal alloy structure may be provided on a substrate, for example, an alloy of nickel and copper on a substrate of silicon, indium tin oxide (ITO) coated glass, or metal sheets or foils (e.g., titanium). After etching, the porous metal structure (here, a nanoporous metal structure) may be separated from the substrate, and used as a film. In a specific example, a Ni—Cu alloy film can be fabricated first by, for instance, electrodeposition onto a silicon substrate, and then etched to remove the copper in the presence of an alternating voltage waveform (e.g., a pulsed voltage waveform) to create nanoporous Ni. Etching in the presence of an alternating voltage profile generally allows for a high degree of control over the structures and compositions of the porous metals generated, e.g., more porous structures and higher purity can easily be achieved. In this example, the Ni has pores of about 50 nm to about 250 nm in diameter, and thinner ligaments (i.e., the wall between the neighboring pores) of about 50 nm over a surface area of, for example, several square centimeters. In addition, the alternating voltage profile effectively lowers the etching threshold, which is the compositional threshold of the more reactive metal or metals (Cu, in this example) required for etching to take place.

A solar cell created according to the present invention has the following benefits compared to conventional solar cells: more efficient light absorption via the highly porous structure; a larger interface area; and lower internal resistance through the more pure nickel framework. In addition, the thickness of the nickel oxide coating can be gradually varied, for example, by tuning the electrodeposition time or the thermal treatment time, along the surface of the porous structure. The gradual variation translates into a gradually changing energy bandgap, which provides a multi junction absorption effect along the film thickness.

Compared with technologies that require a flat substrate surface, the present invention allows for porous materials to be formed on substrates with diverse geometrical features, including, for example, cavity interiors and all sides of a three-dimensional substrate (including rods or spheres or other arbitrary geometries), with substrate dimensions ranging from nanoscales up to macroscales.

The present invention is applicable to a wide range of devices and usages. Expressly without limiting the applicability of the present invention, the fabrication techniques of the present invention can be used to generate, for example: high-absorption photovoltaic electrode materials for solar cells; colored or transparent electrodes useful with displays; high-surface-area metallic sample holders for fluorescence microscopes, infrared spectroscopy, Raman spectroscopy, and mass spectroscopy (e.g., used for in-situ studies in the presence of an electric field or for improving instrument sensitivities due to the surface plasmon resonance effect); electrode materials for light-emitting devices; electrodes used as filters, catalysts and foams; and anti-bacteria particles/pollutant degradation, made possible by fabricating the electrode structure with a coating of one or more photocatalysing substances (such as titanium oxide), such that the porous structure traps and transfers the photonic energy to the photocatalysts.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing an alloy structure of at least two materials; and
   etching the alloy structure by selectively removing at least one and less than all of the at least two materials from the alloy structure in the presence of an alternating voltage profile, wherein the etching comprises forming a plurality of pores in the alloy structure with openings of about 20 nm to about 500 nm in diameter and a purity of a remainder of the alloy structure after the etching of at least about 70 percent for at least one remaining material of the at least two materials.

2. The method of claim 1, wherein the alloy structure comprises a metal alloy structure, wherein the at least two materials comprise at least two metals, and wherein the etching creates a nanoporous metal structure.

3. The method of claim 2, wherein the at least two metals comprise at least two of tungsten, tin, iron, nickel, gold, silver, copper and platinum.

4. The method of claim 3, wherein the at least two metals comprise nickel and copper.

5. The method of claim 1, wherein the alternating voltage profile comprises a periodic voltage profile.

6. The method of claim 2, wherein the providing comprises:
   providing a solution of at least two metal salts; and
   generating the metal alloy structure from the solution.

7. The method of claim 2, wherein the selectively removing comprises using an electrochemical process.

8. The method of claim 1, wherein selectively removing comprises selectively dissolving the one or more metals in a solution.

9. The method of claim 2, wherein the metal alloy structure comprises a film.

10. The method of claim 2, further comprising treating the nanoporous metallic structure to add, remove and/or modify one or more properties thereof.

11. The method of claim 10, wherein the treating comprises causing one or more chemical species to attach to a surface of the nanoporous metallic structure.

12. The method of claim 10, wherein the treating comprises at least partially filling at least one pore of the nanoporous metallic structure with one or more materials.

13. The method of claim 12, wherein the one or more materials comprises at least one pharmaceutical.

14. The method of claim 10, wherein the treating comprises heating in a predetermined atmosphere to effect a chemical reaction on a surface of the nanoporous metallic structure.

15. The method of claim 14, wherein the predetermined atmosphere comprises oxygen to create a metal oxide on the surface.

16. The method of claim 10, wherein the treating comprises coating a surface of the nanoporous metallic structure with one or more materials.

17. The method of claim 16, wherein the treating comprises electrodeposition.

18. The method of claim 16, wherein the treating comprises electroless plating.

19. The method of claim 2, wherein the providing comprises providing the metal alloy structure on a substrate.

20. The method of claim 19, further comprising separating the nanoporous metallic structure from the substrate.

21. The method of claim 20, further comprising using the separated nanoporous metallic structure as a film.

22. The method of claim 19, wherein the substrate has a non-uniform surface on which the metal alloy structure is provided.

* * * * *